(12) United States Patent
Honda et al.

(10) Patent No.: US 6,583,453 B2
(45) Date of Patent: Jun. 24, 2003

(54) SEMICONDUCTOR DEVICE HAVING A VOLTAGE-REGULATOR DEVICE

(75) Inventors: Hirotsugu Honda, Kyoto (JP); Masafumi Doi, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/012,219

(22) Filed: Nov. 6, 2001

(65) Prior Publication Data
US 2002/0123185 A1 Sep. 5, 2002

(30) Foreign Application Priority Data
Nov. 7, 2000 (JP) ........................................ 2000-338577

(51) Int. Cl.[7] .............................................. H01L 29/74

(52) U.S. Cl. .................. 257/129; 257/168; 257/339; 257/367; 257/409; 257/487

(58) Field of Search ........................... 257/112, 129, 257/168, 199, 339, 367, 409, 481, 483, 487, 551, 603, 605

(56) References Cited

U.S. PATENT DOCUMENTS 5,027,165 A  * 6/1991 Doluca ..................... 257/469
5,691,558 A  * 11/1997 Davies ..................... 257/367

FOREIGN PATENT DOCUMENTS

| EP | 951 075 | 10/1999 |
| EP | 0951075 A1 | * 10/1999 |
| JP | 11-307787 | 11/1999 |

* cited by examiner

Primary Examiner—David Nelms
Assistant Examiner—Andy Huynh
(74) Attorney, Agent, or Firm—Merchant & Gould P.C.

(57) ABSTRACT

A semiconductor device providing an improved effect of suppressing variation with time of reverse breakdown voltage applied to PN junction, particularly, a voltage-regulator device, is provided. The semiconductor device includes an impurity diffusion layer 15 formed on a surface of a certain-conductivity-type semiconductor substrate or well, the impurity diffusion layer having a conductivity opposite to that of the semiconductor substrate or well, and a device separating insulation film 12 formed at a distance from the impurity diffusion layer, and a distance between an end of the impurity diffusion layer and an end of the device separating insulation film is defined to be not less than 1.2 $\mu$m.

8 Claims, 7 Drawing Sheets

SEMICONDUCTOR DEVICE HAVING A VOLTAGE-REGULATOR DEVICE

BACKGROUND OF THE INVENTION

1. Field of the Invention

The present invention relates generally to a semiconductor device for use in a semiconductor integrated circuit, and particularly relates to a voltage-regulator device in a semiconductor internal boosting circuit in a semiconductor device.

2. Related Background Art

In a semiconductor integrated circuit, an internal boosting circuit that utilizes a power source voltage to generate a voltage higher than the power source voltage is used often. To obtain a desired constant voltage from the boosted voltage in this semiconductor internal boosting circuit, a voltage regulator device that is called a clamp diode has been used conventionally. The voltage regulator device that is called a clamp diode is also is called a Zener diode, which is a device for obtaining a desired constant voltage utilizing a reverse breakdown phenomenon in a PN junction between a semiconductor substrate or a well and an impurity diffusion layer formed on the semiconductor substrate.

For instance, FIG. 6 is a cross-sectional view illustrating an example of a structure of a part where a clamp diode of a semiconductor device disclosed in the JP11 (1999)-307787 A is formed. The following description will refer to this drawing.

In FIG. 6, an active region 3 is provided on an N-type well 1 of a semiconductor substrate. The active region 3 is surrounded by a device-separating oxide film 2 so as to be insulated. A medium concentration N-type impurity diffusion layer 4 to be used as a channel stopper is provided immediately under the device separating oxide film 2, a high concentration P-type impurity diffusion layer 5 is provided in the active region 3, and a thin oxide film 6 is provided on a surface of the active region 3.

Furthermore, an electrode 7 is provided via the device separating oxide film 2 on the upper portion of active region 3 so that the electrode 7 circularly surrounds the active region 3. The high concentration P-type impurity diffusion layer 5 and the electrode 7 are connected with a aluminum wire 9 for a high concentration P-type impurity diffusion layer and an aluminum wire 10 for an electrode, respectively, via openings of an interlayer insulation film 8.

In the configuration of such a clamp diode, a desired constant voltage is determined according to a reverse breakdown voltage applied to the PN junction between the high concentration P-type impurity diffusion layer 5 and the N-type well 1.

However, in the foregoing configuration, among electron/positive hole pairs produced by the reverse breakdown phenomenon at the PN junction between the high concentration P-type impurity diffusion layer 5 and the N-type well 1, electrons tend to be trapped at an interface between the device separating oxide film 2 and the medium concentration N-type impurity diffusion layer 4 in the vicinity of a border between the active region 3 and the device separating oxide film 2, and in a region under the electrode 7 centering around an interface between the oxide film 6 and the N-type well 1 in the vicinity of a border between the active region 3 and the device separating oxide film 2. This produces a state in which a depletion layer tends to extend from a surface of the active region 3 to an inside of the N-type well 1. Consequently, it is considered that, when a high voltage is applied to the PN junction, the depletion layer is thickened virtually at a PN junction surface, which weakens an electric field directed from the N-type well 1 to the high concentration P-type impurity diffusion layer 5, thereby gradually raising the reverse breakdown voltage in the PN junction.

Furthermore, a total quantity of trapped electrons per se increases as a quantity of electric charges flowing from the N-type well 1 to the high concentration P-type impurity diffusion layer 5 increases, and this results in an increase in the breakdown voltage with time, as shown in FIG. 7.

The clamp diode structure shown in FIG. 6 is a structure capable of suppressing the variation with time to some extent, and conventionally in many devices, even if a clamp withstand voltage changes with time as shown in FIG. 7, it is acceptable. However, for a semiconductor integrated circuit that requires a more accurate constant voltage, it still has been insufficient.

SUMMARY OF THE INVENTION

Therefore, with the foregoing in mind, it is an object of the present invention to provide a semiconductor device providing an improved effect of suppressing the variation with time of the reverse breakdown voltage applied to the PN junction, particularly, a voltage-regulator device (clamp diode).

To achieve the foregoing object, a first semiconductor device of the present invention includes an impurity diffusion layer formed on a surface of a certain-conductivity-type semiconductor substrate or well, and a device separating insulation film formed at a distance from the impurity diffusion layer. The impurity diffusion layer has a conductivity opposite to that of the semiconductor substrate or well;. A distance between an end of the impurity diffusion layer and an end of the device separating insulation film is defined to be not less than 1.2 μm.

To achieve the foregoing object, a second semiconductor device of the present invention includes an impurity diffusion layer formed on a surface of a certain-conductivity-type semiconductor substrate or well, a device separating insulation film formed at a distance from the impurity diffusion layer, and an electrode formed thereon via a thin insulation film. The impurity diffusion layer has a conductivity opposite to that of the semiconductor substrate or well. The thin insulation film is thinner than at least the device separating insulation film. The electrode terminates at a midpoint between an end of the impurity diffusion layer and an end of the device separating insulation film.

To achieve the foregoing object, a third semiconductor device of the present invention includes an impurity diffusion layer formed on a surface of a certain-conductivity-type semiconductor substrate or well, a device separating insulation film formed at a distance from the impurity diffusion layer, and an electrode formed thereon with a thin insulation film interposed therebetween. The impurity diffusion layer has a conductivity opposite to that of the semiconductor substrate or well. The thin insulation film is at least thinner than the device separating insulation film. The electrode terminates at a midpoint between an end of the impurity diffusion layer and an end of the device separating insulation film. A distance between the end of the impurity diffusion layer and the end of the device separating insulation film is defined to be not less than 1.2 μm.

In the first through third semiconductor devices, the impurity diffusion layer and the semiconductor substrate or well preferably compose a voltage-regulator device. In the second and third semiconductor devices, the electrode preferably is formed to surround the impurity diffusion layer.

Furthermore, in the second and third semiconductor devices, the thin insulation film preferably is formed with not less than two steps.

According to the foregoing configurations, the variation with time of the reverse breakdown voltage applied to the PN junction formed by an impurity diffusion layer and a semiconductor substrate or a well can be suppressed by defining the distance between an end of the impurity diffusion layer and an end of the device separating insulation film to not less than 1.2 µm, and by providing an electrode that terminates at a midpoint between the impurity diffusion layer and the device separating insulation film. Therefore, it is possible to implement a voltage regulator device that is capable of supplying a more accurate constant voltage.

DETAILED DESCRIPTION OF THE INVENTION

The following description will depict preferred embodiments of the present invention.

First Embodiment

Figure 1:
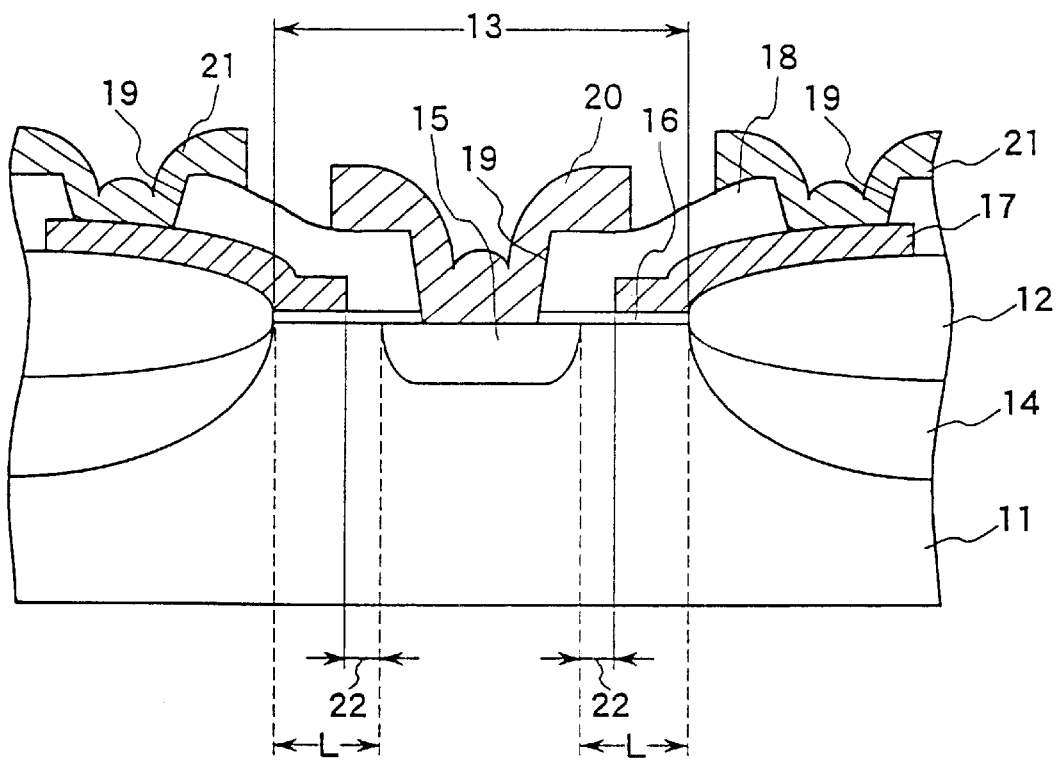
FIG. 1 is a cross-sectional view illustrating an example of a structure of a part of a semiconductor integrated circuit device in which a clamp diode is formed, according to a first embodiment of the present invention.
Figure 2:
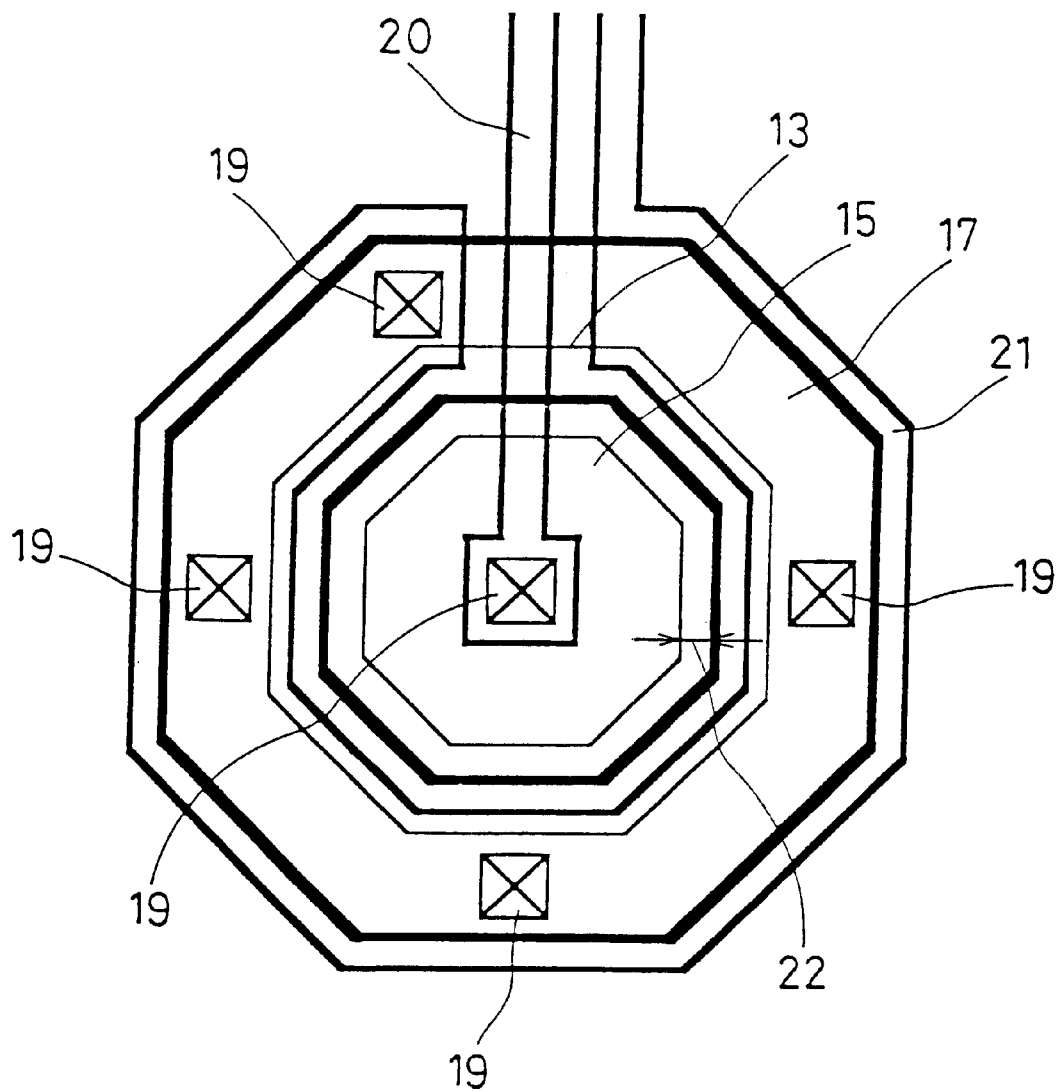
FIG. 2 is a plan view illustrating the clamp diode part shown in FIG. 1.

FIG. 1 is a cross-sectional view illustrating an example of a structure of a part of a semiconductor integrated circuit device in which a clamp diode is formed, according to the first embodiment of the present invention. FIG. 2 is a plan view of the clamp diode part shown in FIG.1.

In FIG. 1 or FIG. 2, 11 denotes an N-type well formed in a P-type or N-type semiconductor substrate, 12 denotes a device separating oxide film, 13 denotes an active region, 14 denotes a medium concentration N-type impurity diffusion layer that is formed under the device separating oxide film 12 so as to serve as a channel stopper, 15 denotes a high concentration P-type impurity diffusion layer composing a clamp diode, 16 denotes a thin oxide film, 17 denotes an electrode, 18 denotes an interlayer insulation film, 19 denotes a contact hole opened in the interlayer insulation film 18, 20 denotes an aluminum wire for a high concentration P-type impurity diffusion layer, 21 denotes an aluminum wire for applying a desired voltage to the electrode 17, and 22 denotes an offset region that separates the high concentration P-type impurity diffusion layer 15 from the electrode 17.

Here, a desired constant voltage is obtained by means of the clamp diode, for instance, in the following manner. The electrode 17 made of a polycrystalline silicon having a single layer structure is, for instance, made in a floating state, and a negative voltage is applied to the high concentration P-type impurity diffusion layer 15 via the aluminum wire 20 for the high concentration P-type impurity diffusion layer until a reverse breakdown voltage applied to the PN junction between the high concentration P-type impurity diffusion layer 15 and the N-type well 11 becomes, for instance, 10 to 20 V.

Next, an operation of a semiconductor device having a clamp diode configured as described above will be described below.

Since the high concentration P-type impurity diffusion layer 15 and the electrode 17 are arranged so as to have an offset structure as described above, an end of the high concentration P-type impurity diffusion layer 15 is formed at a distance L of, for instance, approximately 2 µm, which is greater than the distance in the conventional configuration of 1 µm, from the ends of the device separating oxide film 12 and the medium concentration N-type impurity diffusion layer 14, as well as at a distance of, for instance, approximately 1 µm from an end of the electrode 17. In other words, the offset region 22 has a width of 1 µm.

In such a structure, two types of configurations produce the effect of suppressing the variation of a clamp withstand voltage with time.

The first configuration of the same is such that an end of the PN junction and ends of the device separating oxide film 12 and the medium concentration N-type impurity diffusion layer 14 are separated at a relatively large distance L of approximately 2 µm. In this configuration, among electron/positive hole pairs produced by the reverse breakdown phenomenon at the PN junction between the high concentration P-type impurity diffusion layer 15 and the N-type well 11, a smaller number of electrons reach an interface between the device separating oxide film 12 and the medium concentration N-type impurity diffusion layer 14 in the vicinity of a border between the active region 13 and the device separating oxide film 12, and hence, the number of electrons trapped therein decreases. Thus, even when the electrode 17 is in a floating state, the quantity of electrons trapped during a unit time decreases.

The decrease in the quantity of trapped electrons particularly prevents a depletion layer from extending from a surface of the N-type well 11 due to electric fields of the trapped electrons. Consequently, when a high voltage is applied to the high concentration P-type impurity diffusion layer 15, the thickening of the depletion layer at a PN junction surface is avoided, thereby weakening an electric field directed from the N-type well 11 to the high concentration P-type impurity diffusion layer 15.

On the other hand, in the case where among electron/positive hole pairs produced by the reverse breakdown phenomenon at the PN junction between the high concentration P-type impurity diffusion layer 15 and the N-type well 11, positive holes are trapped, the rate of trapped holes decreases as well. In this case, since the sign indicative of electric charges is opposite to that in the case of electrons, the decrease with time of the clamp withstand voltage can be suppressed.

Next, the second configuration capable of suppressing the variation of the clamp withstand voltage is such that an end of the electrode 17 is formed with an offset of approximately 1 µm from an end of the high concentration P-type impurity diffusion layer 15. Advantages of the second configuration will be described below, while being compared with the conventional case.

Generally, in the case where a clamp diode is formed as a part of a semiconductor integrated circuit, it is formed by utilizing the steps of forming MOS transistors and memory cells that compose the circuit. In the case where a semiconductor integrated circuit includes a MOS transistor actuated with a medium voltage or a high voltage, along with a MOS transistor actuated with a low voltage of approximately 3 V to 5 V, a gate insulation film of the medium or high voltage-actuated MOS transistor is formed to be thicker than a gate insulation film of the low voltage-actuated MOS transistor, so that the former can withstand a medium or high voltage. In such a manufacturing process, the gate insulation film of the low voltage-actuated MOS transistor is formed first, then an insulation film is formed in addition to the gate insulation film so that a thick gate insulation film for the medium or high voltage-actuated MOS transistor is formed.

In this case, in the clamp diode part, the oxide film 16 shown in FIG. 1 is formed in the step of forming the gate insulation film for the medium or high voltage-actuated MOS transistor. Then, the electrode 17 is formed simultaneously when gate electrodes made of polycrystalline silicon are formed for both the MOS transistors. In this case, since the oxide film 16 is formed through two insulation-film-forming steps, an interface is made between the gate insulation film of the low voltage-actuated MOS transistor and the additional insulation film.

It is considered that, at an interface in the gate insulation film thus formed through two steps or an insulation film formed through more than two steps, electrons or positive holes produced by the reverse breakdown phenomenon at the PN junction between the high concentration P-type impurity diffusion layer 15 and the N-type well 11 tend to be trapped.

However, by narrowing the electrode 17 and forming the offset region 22 as in the present embodiment, the oxide film 16 as a base, present in the offset region 22, is etched during the pattern etching for forming the electrode 17, so that an upper layer of the oxide film 16 is removed, whereby the interface of the oxide film 16 can be eliminated. Thus, this hardly causes the trapping of electrons or positive holes in the oxide film 16 in the offset region 22 to occur, and makes it possible to suppress the variation of the clamp withstand voltage in the foregoing part.

It should be noted that in the present embodiment the distance L between the high concentration P-type impurity diffusion layer 15 and the device separating oxide film 12 is set to be 2 μm, but experiments proved that a distance of not less than 1.2 μm is effective. When an electric current stress of 1000 μA was applied for 100 seconds across the high concentration P-type impurity diffusion layer 15 and the N-type well 11, in the case where L=1.0 μm, the clamp withstand voltage exhibited a great variance of approximately 1.7 V. In contrast, in the case where L=1.2 μm, the variance significantly decreased, to approximately 0.3 V. Furthermore, in the case where the distance L was more than 1.2 μm, it exhibited substantially constant variance through the stress application time, at a level of not more than 0.3 V. The foregoing results were obtained utilizing samples in which the oxide film 16 shown in FIG. 1 was formed through one oxidizing step, and the variances were substantially the same as described above, even if the offset distance 22 of the electrode 17 varied.

Furthermore, even if the offset distance between the high concentration P-type impurity diffusion layer 15 and the electrode 17 was set to be 1 μm, the effect can be achieved as long as the electrode 17 terminates between the end of the high concentration P-type impurity diffusion layer 15 and an end of the device separating oxide film 12.

Figure 3:
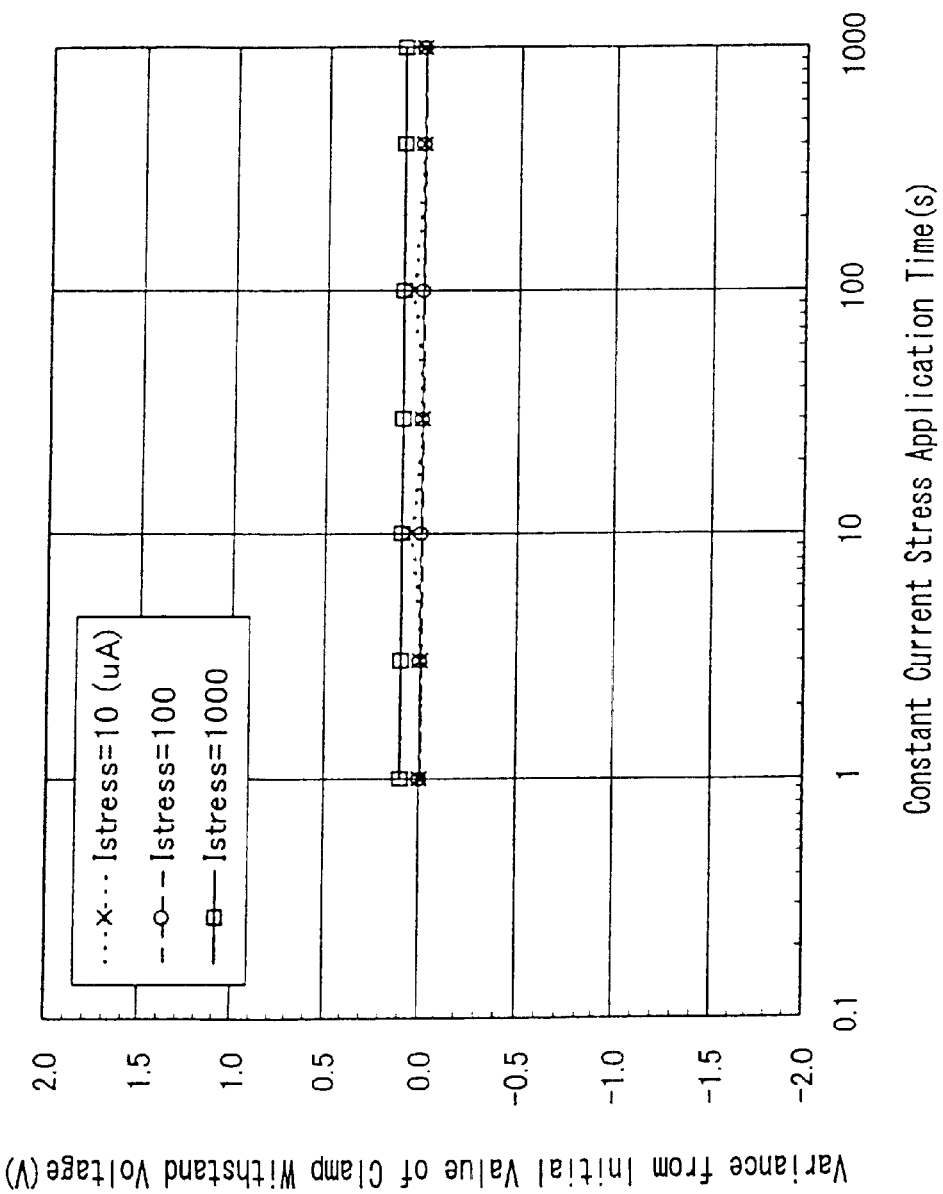
FIG. 3 is a diagram showing the variation with time of a clamp withstand voltage of the clamp diode part according to the first embodiment of the present invention.

FIG. 3 illustrates the results of experiments in which the variation of the clamp withstand voltage with time as to the clamp diode shown in FIG. 1 is illustrated with variances of the same from an initial value of the withstand voltage. It should be noted that the clamp diode structure corresponding to FIG. 3 was such that the distance L between the end of the high concentration P-type impurity diffusion layer 15 and the end of the device separating oxide film 12 was set to be 2 μm, and the distance between the end of the high concentration P-type impurity diffusion layer 15 and the end of the electrode 17 was set to be 1 μm.

Figure 6:
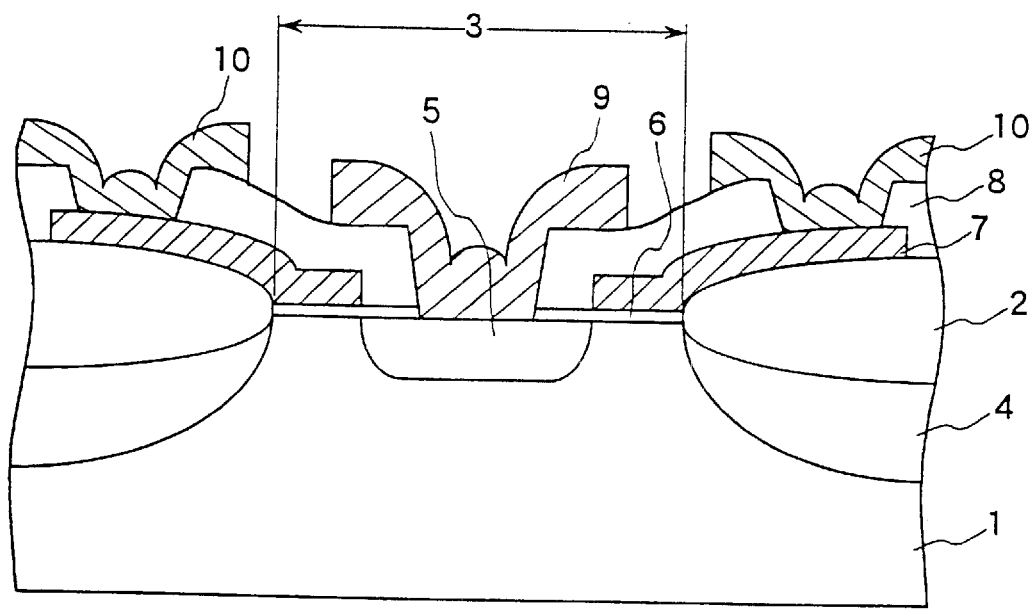
FIG. 6 is a cross-sectional view of a conventional clamp diode part.
Figure 7:
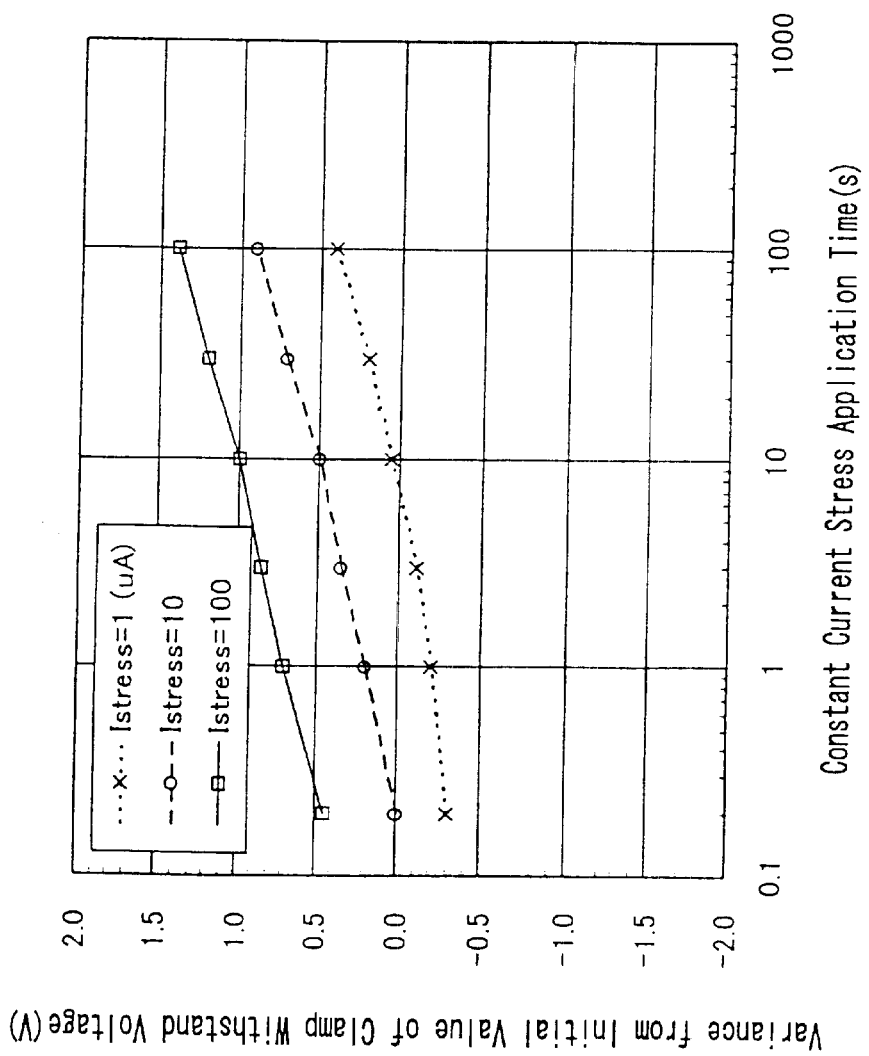
FIG. 7 is a diagram showing variation with time of a clamp withstand voltage of the conventional clam diode part.

A diode shown in FIG. 6 had a conventional structure in which the distance between the end of the high concentration P-type impurity diffusion layer 15 and the end of the device separating oxide film 12 was 1 μm, and as compared with the clamp withstand voltage variation shown in FIG. 7 that the foregoing diode exhibited, the variance from an initial value of the reverse breakdown voltage applied to the PN junction between the N-type well 11 and the high concentration P-type impurity diffusion layer 15 when 1000 seconds elapsed was suppressed to substantially 0 V, as shown in FIG. 3.

In this case, the improvement was achieved principally by an increase in the distance between the end of the high concentration P-type impurity diffusion layer 15 and the end of the device separating oxide film 12, but the variation with time can be suppressed also by making an offset structure in which the high concentration P-type impurity diffusion layer 15 and the electrode 17 are spaced from each other.

Furthermore, with the offset structure of the high concentration P-type impurity diffusion layer 15 and the electrode 17 as in the present embodiment, in the case where the electrode 17 is not made in a floating state but a voltage is applied to the electrode 17, it can be seen by comparing with the conventional structure and arrangement as shown in FIG. 6 that a part of a potential difference between a high voltage applied to the high concentration P-type impurity diffusion layer 15 and a voltage applied to the electrode 17 is not applied to the oxide film 16 directly. Therefore, it can be used even in the case where the potential difference between the high concentration P-type impurity diffusion layer 15 and the electrode 17 is higher than a withstand voltage of the oxide film 16. In other words, an additional effect of making it usable even if the clamp diode has a considerably high set constant voltage can be achieved.

Furthermore, in the configuration of the present embodiment, the electrode 17 is provided around the diode as shown in FIG. 1. In the case where this electrode 17 is biased to a certain fixed potential, it is possible to stabilize the variation with time of the reverse breakdown voltage applied to the PN junction between the N-type well 11 and the high concentration P-type impurity diffusion layer 15. For instance, in the case where many electrons are trapped, the potential of the electrode 17 may be lowered with respect to the potential of the N-type well 11, so as to reduce further the chances that electrons produced by the reverse breakdown phenomenon at the PN junction between the high concentration P-type impurity diffusion layer 15 and the N-type well 11 will be trapped at an interface between the device separating oxide film 12 and the medium concentration N-type impurity diffusion layer 14 in the vicinity of a border between the active region 13 and the device separating oxide film 12, and at an interface between the oxide film 16 and the N-type well 11 in the vicinity of a border between the active region 13 and the device separating oxide film 12.

On the contrary, the potential of the N-type well 11 may be raised with respect to the potential of the electrode 17, so as to reduce further the changes that positive holes produced by the reverse breakdown phenomenon at the PN junction between the high concentration P-type impurity diffusion layer 15 and the N-type well 11 will be trapped at an interface between the device separating oxide film 12 and the medium concentration N-type impurity diffusion layer 14 in the vicinity of a border between the active region 13 and the device separating oxide film 12, and at an interface between the oxide film 16 and the N-type well 11 in the vicinity of a border between the active region 13 and the device separating oxide film 12. The operations described above consequently further suppress the variation with time of the reverse breakdown voltage applied to the PN junction between the N-type well 11 and the high concentration P-type impurity diffusion layer 15.

Here, as a voltage applied to the electrode 17, various voltages of the semiconductor integrated circuit device may be used, for instance, a ground potential, a power source voltage potential, the same potential as that of the high concentration P-type impurity diffusion layer 15, a potential having a potential difference equal to the power source voltage from the potential of the well or semiconductor substrate, or the N-type well 11, etc.

Furthermore, the electrode 17 may not surround the active region 13 throughout its periphery, but be placed on three, two, or one side of the same. Since the effect of causing electrons hardly to be trapped can be achieved as described above on the side/sides where the electrode 17 is placed, the effects of suppressing the variation with time of the reverse breakdown voltage applied to the PN junction between the N-type well and the high concentration P-type impurity diffusion layer 15 in the foregoing cases are ¾, ⅔, and ¼, respectively, but anyway, the effect of suppressing the variation with time can be achieved.

It should be noted that the device separating oxide film 12 is formed by the LOCOS method, but an element separating region may be formed by forming grooves in the semiconductor substrate and embedding insulation films therein, and further, the electrode 17 may be made of polycrystalline silicon, may have a layered structure of polycrystalline silicon and silicide, or may be made of aluminum, as long as it is made of a conductive material basically. Furthermore, as shown in FIG. 2, one contact hole 19 is formed on the high concentration P-type impurity diffusion layer 15, and one contact hole 19 is provided in each of four side parts of the electrode 17, but it goes without saying that a plurality of the same may be provided.

Second Embodiment

Figure 4:
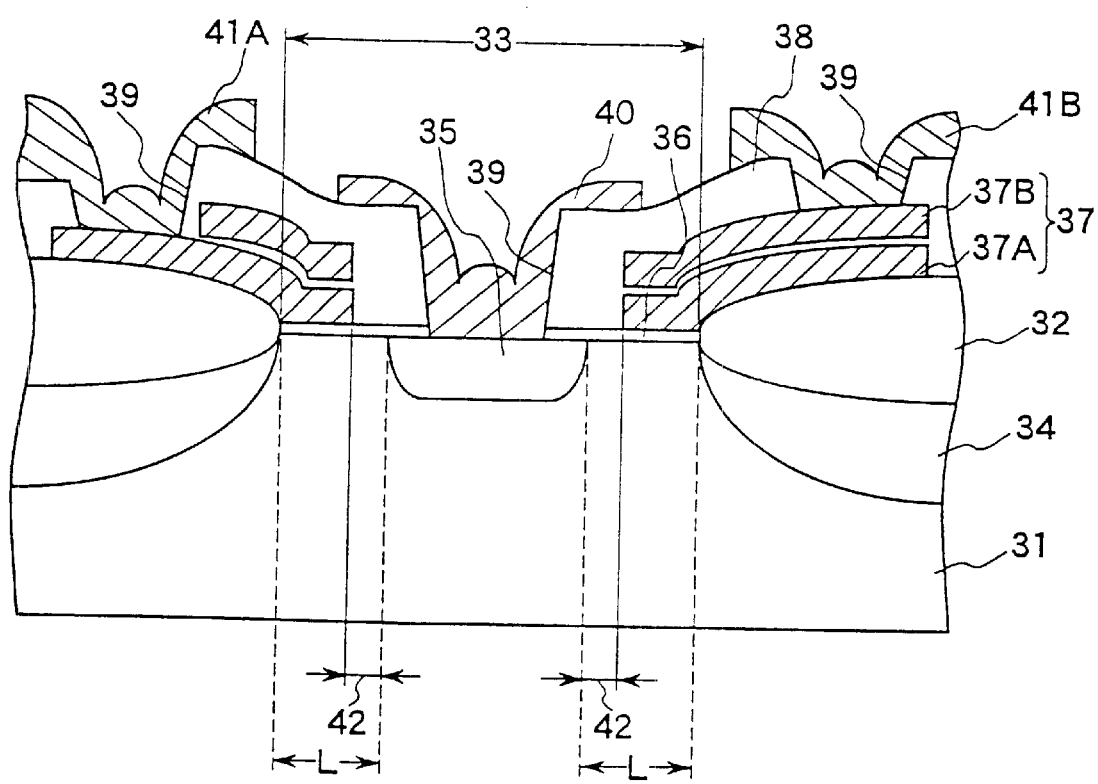
FIG. 4 is a cross-sectional view illustrating an example of a structure of a part of a semiconductor integrated circuit device in which a clamp diode is formed, according to a second embodiment of the present invention.
Figure 5:
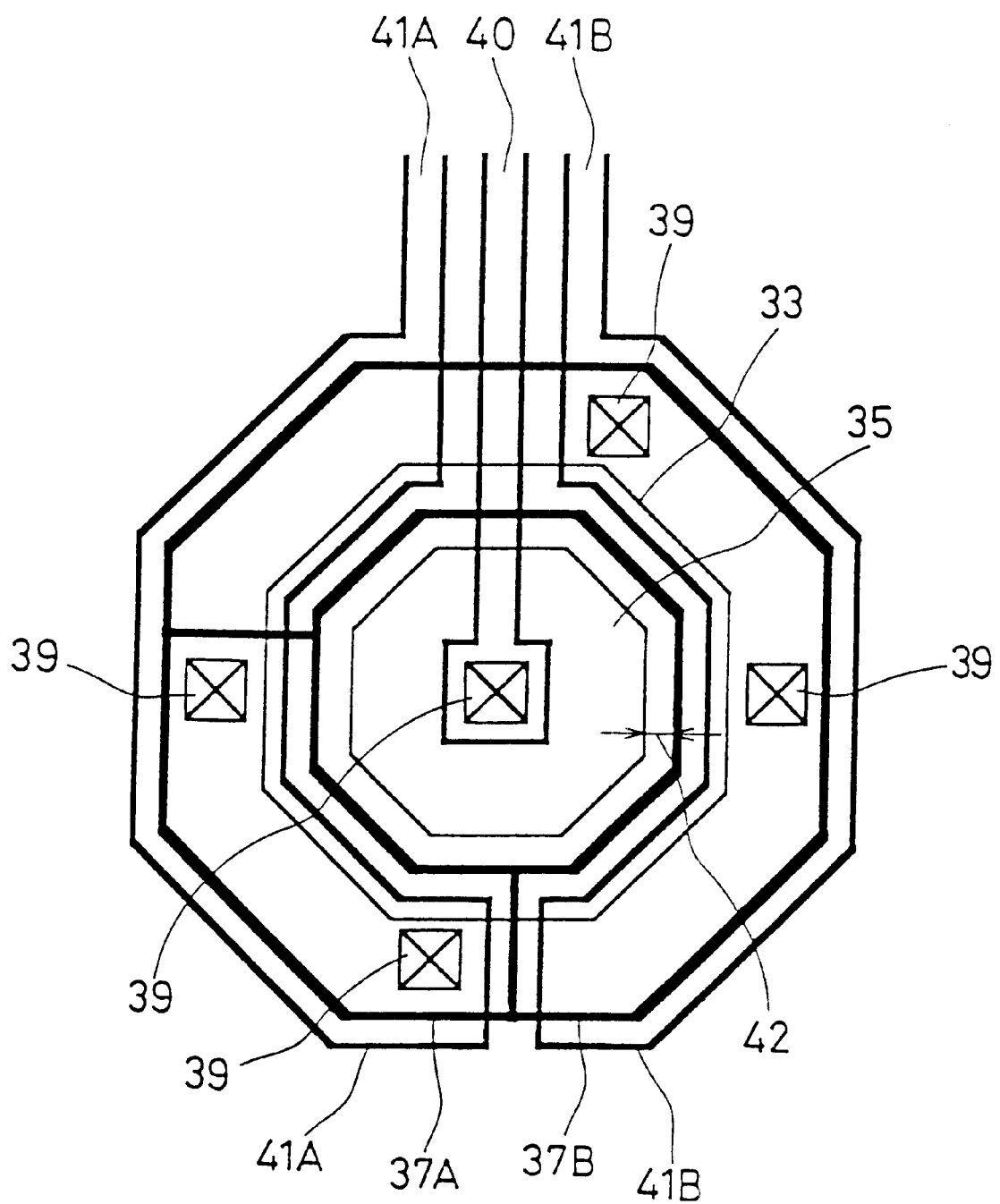
FIG. 5 is a plan view illustrating the clamp diode part shown in FIG. 4.

FIG. 4 is a cross-sectional view illustrating an example of a part of a semiconductor integrated circuit device in which a clamp diode is formed according to the second embodiment of the present invention, and FIG. 5 is plan view illustrating a clamp diode part shown in FIG. 4.

In FIG. 4 or FIG. 5, 31 denotes an N-type well, 32 denotes a device separating oxide film, 33 denotes an active region, 34 denotes a medium concentration N-type impurity diffusion layer, 35 denotes a high concentration P-type impurity diffusion layer, 36 denotes a thin oxide film, 37A denotes a first layer electrode, 37B denotes a second layer electrode (37 denotes a two-layer electrode including the first and second layer electrodes 37A and 37B), 38 denotes an interlayer insulation film, 39 denotes a contact hole opened in the interlayer insulation film 38, and 40 denotes an aluminum wire for the high concentration P-type impurity diffusion layer 35 41A denotes an aluminum wire for the first layer electrode 37A, 41B denotes an aluminum wire for the second layer electrode 37B, and they are arranged so as to apply bias voltages independently. 42 denotes an offset region that separates the high concentration P-type impurity diffusion layer 35 from the electrodes 37A and 37B.

The clamp diode part is formed simultaneously when, for instance, memory cells or the like having two-layer laminated electrodes are formed in a semiconductor integrated circuit. In this case, the first layer electrode 37A is formed simultaneously when a floating gate electrode of a memory cell transistor is formed, while the second layer electrode 37B is formed simultaneously when the control gate electrode thereof is formed. A thin interlayer insulation film is formed between the first layer electrode 37A and the second layer electrode 37B. The oxide film 36 is formed simultaneously when the gate oxide film of the memory cell transistor is formed.

A desired clamp diode constant voltage is obtained, for instance, in the following manner. The first layer electrode 37A made of polycrystalline silicon having a two-layer structure is, for instance, made in a floating state, and a negative voltage is applied to the high concentration P-type impurity diffusion layer 35 via the aluminum wire 40 for the high concentration P-type impurity diffusion layer until the PN junction between the high concentration P-type impurity diffusion layer 35 and the N-type well 31 has a reverse breakdown voltage. Alternatively, the first layer electrode 37A is, for instance, made in a floating state, and a positive voltage is applied to the N-type well 31 until the PN junction between the high concentration P-type impurity diffusion layer 35 and the N-type well 31 has a reverse breakdown voltage.

Since the clamp diode structure shown in FIG. 4 has a configuration in which the high concentration P-type impurity diffusion layer 35 and the electrode 37 have an offset structure, an end of the high concentration P-type impurity diffusion layer 35 is formed at a distance L of, for instance, approximately 2 μm, which is greater than the distance in the conventional configuration, from an end of the device separating oxide film 32 and the medium concentration N-type impurity diffusion layer 34, as well as at a distance of, for instance, approximately 1 μm from an end of the electrode 37. Therefore, since the distance is greater than that in the conventional case shown in FIG. 6, the electrons or the positive holes produced by the reverse breakdown phenomenon at the PN junction between the high concentration P-type impurity diffusion layer 35 and the N-type well 31 hardly reach an interface between the device separating oxide film 32 and the medium concentration N-type impurity diffusion layer 34 in the vicinity of a border between the active region 33 and the device separating oxide film 32, thereby hardly being trapped therein.

Therefore, even when the first layer electrode 37A and the second layer electrode 37B are in a floating state, the quantity of electrons or positive holes trapped during a unit time decreases. Consequently, the electric field directed from the N-type well 31 to the high concentration P-type impurity diffusion layer 35 on the PN junction structure is weakened in the case where electrons are trapped, while the rising speed of the electric field is lowered in the case where positive holes are trapped, whereby the variation with time of the reverse breakdown voltage applied to the PN junction between the N-type well 31 and the high concentration P-type impurity diffusion layer 35 can be suppressed. In other words, the clamp current dependency of the reverse breakdown voltage applied to the PN junction between the N-type well 31 and the high concentration P-type impurity diffusion layer 35 decreases.

Furthermore, in the clamp diode structure shown in FIG. 4, it is possible to bias the first layer electrode 37A to any fixed potential. However, by lowering the potential of the first layer electrode 37A with respect to the potential of the N-type well 31, it is possible to reduce further the chances that electrons produced by the reverse breakdown phenomenon at the PN junction between the high concentration P-type impurity diffusion layer 35 and the N-type well 31 will be trapped at an interface between the device separating oxide film 32 and the medium concentration N-type impurity diffusion layer 34 in the vicinity of a border between the active region 33 and the device separating oxide film 32, and at an interface between the oxide film 36 and the N-type well 31 in the vicinity of a border between the active region 33 and the device separating oxide film 32. Consequently it is possible to suppress further the variation with time of the reverse breakdown voltage applied to the PN junction between the N-type well 31 and the high concentration P-type impurity diffusion layer 35.

On the contrary, by raising the potential of the first layer electrode 37A with respect to the potential of the N-type well 31, it is possible to reduce further the chances that positive holes produced by the reverse breakdown phenomenon at the PN junction between the high concentration P-type impurity diffusion layer 35 and the N-type well 31 will be trapped at an interface between the device separating oxide film 32 and the medium concentration N-type impurity diffusion layer 34 in the vicinity of a border between the active region 33 and the device separating oxide film 32, and at an interface between the oxide film 36 and the N-type well 31 in the vicinity of a border between the active region 33 and the device separating oxide film 32. Consequently it is possible to suppress further the variation with time of the reverse breakdown voltage applied to the PN junction between the N-type well 31 and the high concentration P-type impurity diffusion layer 35.

Furthermore, in the foregoing configuration as well, since the high concentration P-type impurity diffusion layer 35 and the electrode 37 are arranged so as to have an offset structure, a potential difference between the high concentration P-type impurity diffusion layer 35 and the first layer electrode 37A is not applied to the oxide film 36 directly. Therefore, it can be used even in the case where a high voltage is applied to the high concentration P-type impurity diffusion layer 35 or the like so that the potential difference between the high concentration P-type impurity diffusion layer 35 and the first layer electrode 37A is higher than a withstand voltage of the oxide film 36.

Furthermore, in the clamp diode of the present embodiment, the first layer electrode 37A or the like surrounds the active region 33 throughout its periphery, but the first layer electrode 37A may be placed on three sides, two sides, or one side of the same. Since on the side/sides where the electrode 37A is provided, a bias can be applied to the electrode 37A as described above, the effects of suppressing the variation with time of the reverse breakdown voltage applied to the PN junction between the N-type well 31 and the high concentration P-type impurity diffusion layer 35 in the foregoing cases are ¾, 2/4, and ¼, respectively, but anyway, the effect of suppressing the variation with time can be achieved.

It should be noted that the device separating oxide film 32 is formed by the LOCOS method, but a device separating region may be formed by forming grooves in the semiconductor substrate and embedding insulation films therein, and further, the electrode 37 may be made of polycrystalline silicon, may have a layered structure of polycrystalline silicon and suicide, or may be made of aluminum, as long as it is made of a conductive material basically. Furthermore, as shown in FIG. 5, one contact hole 39 is formed on the high concentration P-type impurity diffusion layer 35, and one contact hole 39 is formed in each of four side parts of electrode 37, but a plurality of the same may be formed.

Furthermore, as described above, in the case where the potential of the first layer electrode 37A is specified when used, the potential of the second electrode 37B may be in a floating state or be any fixed potential, as long as it is in a withstand voltage range of the thin interlayer insulation film provided between the first layer electrode 37A and the second electrode 37B.

As described above, according to the present invention, the variation with time of the reverse breakdown voltage applied to the PN junction formed by an impurity diffusion layer and a semiconductor substrate or a well can be suppressed by specifying the distance between an end of the impurity diffusion layer and an end of the device separating insulation film to not less than tan 1.2 $\mu$m, and by providing an electrode terminating at a midpoint between the impurity diffusion layer and the device separating insulation film. Therefore, it is possible to implement a voltage regulator device that is capable of supplying a more accurate constant voltage.

What is claimed is:

1. A semiconductor device, comprising:
   an impurity diffusion layer formed on a surface of a certain-conductivity-type semiconductor substrate or well, the impurity diffusion layer having a conductivity opposite to that of the semiconductor substrate or well;
   a device separating insulation film formed at a distance from the impurity diffusion layer; and
   an electrode formed thereon via a thin insulation film, the thin insulation film being at least thinner than the device separating insulation film, the electrode terminating at a midpoint between an end of the impurity diffusion layer and an end of the device separating insulation film.

2. The semiconductor device according to claim 1, wherein the impurity diffusion layer and the semiconductor substrate or well compose a voltage-regulator device.

3. The semiconductor device according to claim 1, wherein the electrode surrounds the impurity diffusion layer.

4. The semiconductor device according claim 1, wherein the thin insulation film is formed with not less than two steps.

5. A semiconductor device, comprising:
   an impurity diffusion layer formed on a surface of a certain-conductivity-type semiconductor substrate or well, the impurity diffusion layer having a conductivity opposite to that of the semiconductor substrate or well;
   a device separating insulation film formed at a distance from the impurity diffusion layer; and
   an electrode formed thereon via a thin insulation film, the thin insulation film being at least thinner than the device separating insulation film, the electrode terminating at a midpoint between an end of the impurity diffusion layer and an end of the device separating insulation film,
   wherein a distance between the end of the impurity diffusion layer and the end of the device separating insulation film is defined to be not less than 1.2 $\mu$m.

6. The semiconductor device according to claim 5, wherein the impurity diffusion layer and the semiconductor substrate or well compose a voltage-regulator device.

7. The semiconductor device according to claim 5, wherein the electrode surrounds the impurity diffusion layer.

8. The semiconductor device according claim 5, wherein the thin insulation film is formed with not less than two steps.

* * * * *